United States Patent
Jeong

(10) Patent No.: US 8,476,671 B2
(45) Date of Patent: Jul. 2, 2013

(54) LIGHT EMITTING DEVICE, LIGHT EMITTING DEVICE PACKAGE, AND LIGHTING DEVICE

(75) Inventor: Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/080,796

(22) Filed: Apr. 6, 2011

(65) Prior Publication Data

US 2011/0284864 A1 Nov. 24, 2011

(30) Foreign Application Priority Data

May 18, 2010 (KR) .................. 10-2010-0046249

(51) Int. Cl.
*H01L 33/00* (2010.01)
*H01L 21/00* (2006.01)

(52) U.S. Cl.
USPC ...... 257/103; 257/91; 257/101; 257/E33.028; 257/E33.029; 438/29; 438/37

(58) Field of Classification Search
USPC .................. 257/101, 103, E33.028, E33.029, 257/91; 438/29, 37
See application file for complete search history.

(56) References Cited

U.S. PATENT DOCUMENTS

| 6,964,877 | B2 * | 11/2005 | Chen et al. | 438/20 |
|---|---|---|---|---|
| 7,821,024 | B2 * | 10/2010 | Jeong | 257/98 |
| 7,943,924 | B2 * | 5/2011 | Bergmann et al. | 257/11 |
| 2002/0175352 | A1 * | 11/2002 | Cao | 257/258 |
| 2003/0218179 | A1 * | 11/2003 | Koide et al. | 257/95 |
| 2005/0224832 | A1 * | 10/2005 | Wu et al. | 257/103 |
| 2006/0049417 | A1 * | 3/2006 | Li et al. | 257/96 |
| 2006/0054907 | A1 * | 3/2006 | Lai | 257/96 |
| 2006/0065901 | A1 * | 3/2006 | Aoyagi et al. | 257/79 |
| 2007/0018183 | A1 * | 1/2007 | Denbaars et al. | 257/98 |
| 2007/0145396 | A1 * | 6/2007 | Watanabe et al. | 257/98 |
| 2007/0252135 | A1 * | 11/2007 | Lee | 257/22 |
| 2008/0042149 | A1 * | 2/2008 | Yoon et al. | 257/79 |
| 2008/0149955 | A1 * | 6/2008 | Nakamura et al. | 257/96 |
| 2008/0272382 | A1 * | 11/2008 | Kim et al. | 257/94 |
| 2009/0072220 | A1 * | 3/2009 | Lee | 257/13 |
| 2009/0159917 | A1 * | 6/2009 | Jeong | 257/98 |
| 2011/0175124 | A1 * | 7/2011 | Bae et al. | 257/98 |

FOREIGN PATENT DOCUMENTS

| CN | 1453885 | 11/2003 |
|---|---|---|
| JP | 2006-100475 A | 4/2006 |
| KR | 10-2005-0039753 A | 4/2005 |
| KR | 10-0762003 B1 | 9/2007 |
| KR | 10-2008-0032882 A | 4/2008 |
| KR | 10-0820546 B1 | 4/2008 |

OTHER PUBLICATIONS

Chinese Office Action dated Mar. 4, 2013 for Application 201110101253.4.

* cited by examiner

*Primary Examiner* — Cheung Lee
*Assistant Examiner* — Jeremy Joy
(74) *Attorney, Agent, or Firm* — KED & Associates, LLP

(57) ABSTRACT

A light emitting device includes a support member, a light emitting structure on the support member, the light emitting structure including a first conductive type semiconductor layer, a second conductive type semiconductor layer, and an active layer between the second conductive type semiconductor layer and the first conductive type semiconductor layer, a first nitride semiconductor layer disposed on the second conductive type semiconductor layer, a second nitride semiconductor layer disposed on the first nitride semiconductor layer and including an uneven structure, and a first electrode pad disposed on the light emitting structure wherein the second nitride semiconductor layer has an opening, the first electrode pad is in contact with the first nitride semiconductor layer through the opening, and the first nitride semiconductor layer has a work function smaller than that of the second nitride semiconductor layer.

17 Claims, 16 Drawing Sheets

LIGHT EMITTING DEVICE, LIGHT EMITTING DEVICE PACKAGE, AND LIGHTING DEVICE

CROSS REFERENCE TO RELATED APPLICATION

This application claims the benefit of the Patent Korean Application No. 10-2010-0046249, filed on May 18, 2010, which is hereby incorporated by reference as if fully set forth herein.

BACKGROUND OF THE DISCLOSURE

1. Field of the Disclosure

The present invention relates to a light emitting device, a light emitting device package, and a lighting device.

2. Discussion of the Related Art

The light emitting device, such as a light emitting diode of third to fifth group or second to sixth group compound semiconductor material or a laser diode, can produce different colors, such as red, blue, and ultra-violet owing to development of the thin film growth technology and materials therefore, as well as a white color of good efficiency by using a fluorescent material or mixing colors, and is advantageous in that the light emitting device has power consumption lower than the present light sources, such as a fluorescent light and an incandescent light, a fast response speed, and safe, and is environment friendly.

Accordingly, application of the light emitting device is expanding even to transmission modules of optical communication means, a light emitting diode back light unit which is replacing CCFL (Cold Cathode Fluorescence Lamp) of the back light unit in an LCD (Liquid Crystal Display) device, white light emitting diode lighting fixtures, car head lights, and signal lamps.

SUMMARY OF THE DISCLOSURE

The present invention is directed to a light emitting device, a light emitting device package, and a lighting device.

The present invention is to provide a light emitting device, a light emitting device package, and a lighting device which have improved optical efficiency and a reduced operation voltage.

The disclosure will be set forth in part in the description which follows and in part will become apparent to those having ordinary skill in the art upon examination of the following or may be learned from practice of the invention. The invention may be realized and attained by the structure particularly pointed out in the written description and claims hereof as well as the appended drawings.

A light emitting device includes a support member, a light emitting structure on the support member, the light emitting structure including a first conductive type semiconductor layer, a second conductive type semiconductor layer, and an active layer between the second conductive type semiconductor layer and the first conductive type semiconductor layer, a first nitride semiconductor layer disposed on the second conductive type semiconductor layer, a second nitride semiconductor layer disposed on the first nitride semiconductor layer and having an uneven structure, and a first electrode pad disposed on the light emitting structure, wherein the second nitride semiconductor layer has an opening, the first electrode pad is in contact with the first nitride semiconductor layer through the opening, and the first nitride semiconductor layer has a work function smaller than that of the second nitride semiconductor layer.

The second nitride semiconductor layer can be a nitride semiconductor layer including indium. Or, the first nitride semiconductor layer and the second nitride semiconductor layer can be formed of nGaN, and the first nitride semiconductor layer includes indium.

Or, the first nitride semiconductor layer and the second nitride semiconductor layer can be constructed of nitride semiconductor layers including indium, respectively. An indium content of the first nitride semiconductor layer can be greater than that of the second nitride semiconductor layer.

The support member can be formed of a conductive material including at least one selected from copper, gold Au, nickel Ni, molybdenum Mo, copper-tungsten Cu—W, and can further comprise an ohmic layer between the support member and the light emitting structure.

The support member can be a substrate having light transmissivity.

The second conductive type semiconductor layer, the active layer, and the first conductive type semiconductor can be mesa etched to expose a portion of the first conductive type semiconductor layer, and the light emitting device further comprises a second electrode pad disposed on an exposed region of the first conductive type semiconductor layer.

The first electrode pad can be disposed in the opening to be spaced from the second nitride semiconductor layer having the uneven structure. The uneven structure can include a photonic crystal structure or a roughness.

The first nitride semiconductor layer can have the roughness at a portion exposed by the opening. The first electrode pad can be in contact with the roughness of the first nitride semiconductor layer. The light emitting device can further comprise a reflective layer disposed between the support member and the ohmic layer. The light emitting device can further comprise a current blocking layer disposed between the ohmic layer and the second conductive type semiconductor layer. The light emitting device can further comprise an insulating layer disposed at a side of each of the light emitting structure, the first nitride semiconductor layer, and the second nitride semiconductor layer. The light emitting device can further comprise a protective layer disposed on the support member to surround sides of the reflective layer and the ohmic layer.

In another aspect of the present invention, a light emitting device package includes a package body, a light emitting device on the package body, a first electrode layer and a second electrode layer disposed on the package body connected to the light emitting device, and a filling material enclosing the light emitting device, wherein the light emitting device includes a support member, a light emitting structure on the support member, the light emitting structure including a first conductive type semiconductor layer, a second conductive type semiconductor layer and a active layer between the second conductive type semiconductor layer and the first conductive type semiconductor layer, a first nitride semiconductor layer disposed on the second conductive type semiconductor layer, a second nitride semiconductor layer disposed on the first nitride semiconductor layer and having an uneven structure, and a first electrode pad disposed on the light emitting structure, wherein the second nitride semiconductor layer has an opening which exposes the first nitride semiconductor layer, the first electrode pad is in contact with the first nitride semiconductor layer through the opening, and the first nitride semiconductor layer has a work function smaller than that of the second nitride semiconductor layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Figure 1:
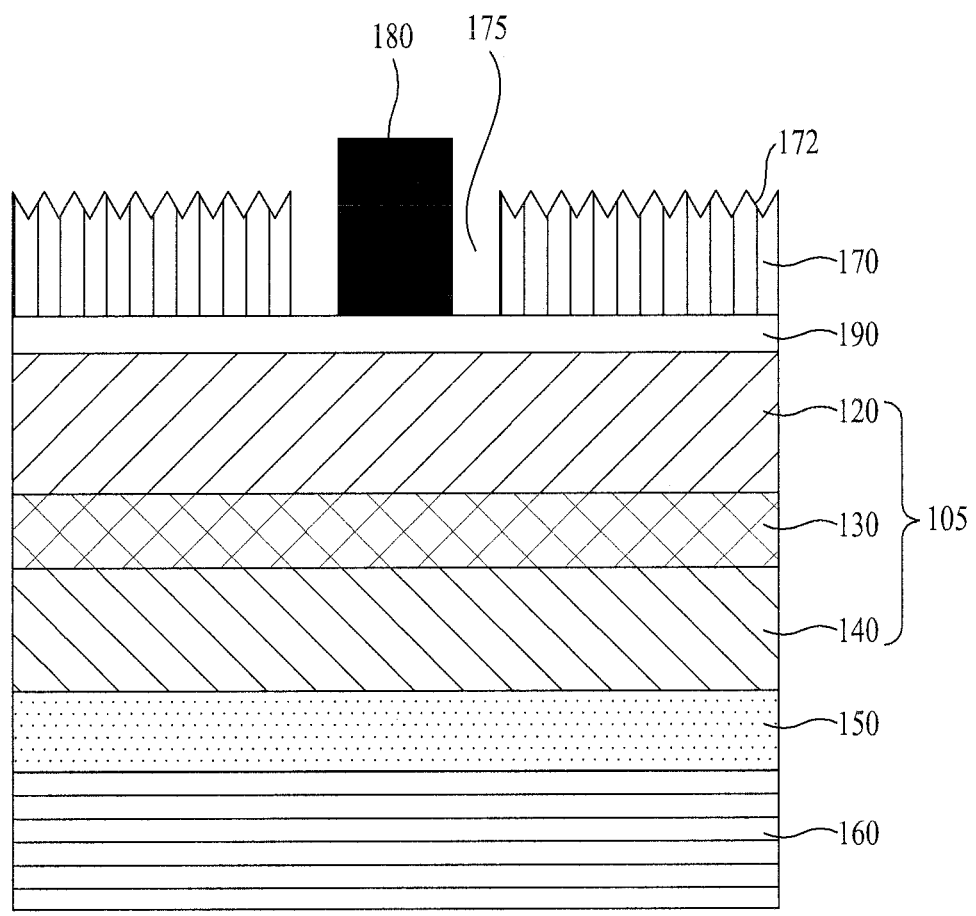
FIG. 1 illustrates a section of a light emitting device in accordance with a preferred embodiment of the present invention.

Reference will now be made in detail to the specific embodiments of the present invention, examples of which are illustrated in the accompanying drawings. Wherever possible, the same reference numbers will be used throughout the drawings to refer to the same or like parts.

It is required to understand that, description of embodiments that a layer (a film), a region, a pattern, or a structure is formed "on" or "under" a substrate, a layer (a film), a region, a pad, or pattern, the "on", or "under" implies that the layer (the film), the region, the pattern, or the structure is formed "on" or "under" the substrate, the layer (the film), the region, the pad, or the pattern directly or indirectly. And, a reference on the "on" or "under" is the drawing.

A thickness or a size of a layer shown in a drawing is exaggerated, omitted or shown schematically for convenience or clarity of description. And, a size of an element is not shown to scale, perfectly.

FIG. 1 illustrates a perspective view of a light emitting device in accordance with a preferred embodiment of the present invention. As shown in FIG. 1, the light emitting device 100 includes a conductive metal support 160, an ohmic layer 150, a light emitting structure 105, a first nitride semiconductor layer 190, a second nitride semiconductor 170, and a first electrode pad 180.

The conductive metal support 160 supports the light emitting structure 105. The conductive metal support 160 includes at least one of, for an example, copper Cu, gold Au, nickel Ni, molybdenum Mo, copper-tungsten Cu—W, and includes single or multiple layers. The conductive metal support 160 can serve as an electrode connected to a second conductive type semiconductor layer 140 to be described later.

And, though the conductive metal support 160 can be provided as a substrate of the light emitting device 100, and the nitride semiconductor can be disposed on the conductive metal support 160 directly, by forming the ohmic layer 150 of a transparent electrode and the like, ohmic characteristics of the nitride semiconductor and the conductive metal support 160 can be improved.

The ohmic layer 150 is disposed on the conductive metal support 160 to be in ohmic contact with the second conductive type semiconductor layer 140 of the light emitting structure 105 for smooth supply of power to the light emitting structure 105.

The ohmic layer 150 can use a light transmissive conductive layer and metal selectively, and includes at least one selected from ITO(indium tin oxide), IZO(indium zinc oxide), IZTO(indium zinc tin oxide), IAZO(indium aluminum zinc oxide), IGZO(indium gallium zinc oxide), IGTO (indium gallium tin oxide), AZO(aluminum zinc oxide), ATO (antimony tin oxide), GZO(gallium zinc oxide), $IrO_x$, $RuO_x$, $RuO_x$/ITO, Ni, Ag, Pt, Rh, Ni/$IrO_x$/Au, and Ni/$IrO_x$/Au/ITO, and can be constructed of single layer or multiple layer. Particularly, the ohmic layer 150 can be a transparent electrode layer having two layers including Ni and Au. The transparent electrode layer increases a current injection area and forms ohmic contact so as to drop a forward direction voltage $V_f$.

A reflective layer (not shown) can be disposed between the ohmic layer 150 and the conductive metal support 160 for reflecting a light from the light emitting structure 105 to improve optical extraction efficiency. The reflective layer can be formed of a metal selected from at least one of Ag, Ni, Al, Rh, Pd, Ir, Ru, Mg, Zn, Pt, Au, Hf or an alloy thereof.

And, the light emitting structure 105 is disposed on the ohmic layer 150 and includes the second conductive type semiconductor layer 140, an active layer 130, and a first conductive type semiconductor layer 120.

The second conductive type semiconductor layer 140 can be, for an example, a p-type semiconductor layer selected from a semiconductor material having composition of $In_xAl_yGa_{1-x-y}N$ ($0 \leq x \leq 1$, $0 \leq y \leq 1$, $0 \leq x+y \leq 1$), for an example, GaN, AlN, AlGaN, InGaN, InN, InAlGaN, AlInN, and can be doped with a p-type dopant, such as Mg, Zn, Ca, Sr, Ba.

The active layer 130 is disposed on the second conductive type semiconductor layer 140. The active layer 130 can include, for an example, a semiconductor material having composition of $In_xAl_yGa_{1-x-y}N$ ($0 \leq x \leq 1$, $0 \leq y \leq 1$, $0 \leq x+y \leq 1$), and can include at least one selected from a quantum wire structure, a quantum dot structure, a single quantum well structure, or a multi quantum well structure MQW.

The active layer 130 can emit a light with energy generated in a process of recombination of an electron and a hole provided from the first semiconductor layer 120 and the second conductive type semiconductor layer 140.

The first conductive type semiconductor layer 120 is disposed on the active layer 130. The first conductive type semiconductor layer 120 can include, for an example, an n-type semiconductor layer selected from a semiconductor material having composition of $In_xAl_yGa_{1-x-y}N$ ($0 \leq x \leq 1$, $0 \leq y \leq 1$, $0 \leq x+y \leq 1$) for an example, GaN, AlN, AlGaN, InGaN, InN, InAlGaN, AlInN, and can be doped with an n-type dopant, such as Si, Ge, Sn, Se, Te.

An undoped semiconductor layer (not shown) can be disposed between the first conductive type semiconductor layer 120 and the active layer 130. The undoped semiconductor layer, formed for improving crystallinity of the first conductive type semiconductor layer, can be identical to the first conductive type semiconductor layer 120 except the undoped semiconductor layer has electric conductivity lower than the first conductive type semiconductor layer 120 since the undoped semiconductor has no n-type dopant doped therein.

In this instance, different from above, the first conductive type semiconductor layer 120 can include the p-type semiconductor layer, and the second conductive type semiconductor layer 140 can include the n-type semiconductor layer. And, a third conductive type semiconductor layer (not shown) including an n-type semiconductor layer or a p-type semiconductor layer can be formed on the first semiconductor layer 120, enabling the light emitting device of the embodiment to have at least one of np, pn, npn, and pnp junction structure. A doping concentration of a conductive type dopant in the first conductive type semiconductor layer 120 and the second conductive type semiconductor layer 140 may or may not be uniform. That is, the plurality of the semiconductor layers can have a variety of structures, and the present invention does not limit the structures.

The first nitride semiconductor layer 190 is disposed on the first conductive type semiconductor layer 120 and can be a nitride semiconductor including indium. For an example, the first nitride semiconductor layer 190 can be an InGaN layer. The InGaN layer can be formed by doping indium In to nGaN, and can be formed at a thickness of 0.01~5.0 µm.

The second nitride semiconductor layer 170 is disposed on the first nitride semiconductor layer 190, and the second nitride semiconductor layer 170 has a surface which can be patterned to have an uneven shape 172. The second nitride semiconductor layer 170 can be $n^-$ doped semiconductor material having composition of $In_xAl_yGa_{1-x-y}N$ (Where, $0 \leq x \leq 1$, $0 \leq y \leq 1$, $0 \leq x+y \leq 1$), and can be formed at a thickness of 0.01~5.0 µm. The second nitride semiconductor layer 170 has a work function smaller than that of the first nitride semiconductor layer 190.

For an example, the first nitride semiconductor layer 190 can be indium doped nGaN, and the second nitride semiconductor layer 170 can be NGaN. Or, the first nitride semiconductor layer 190 and the second nitride semiconductor layer 170 can be indium doped nGaN respectively, and an indium content of the first nitride semiconductor layer 190 can be greater than that of the second nitride semiconductor layer 170.

The second nitride semiconductor layer 170 has the surface having the uneven shape 172 formed thereon. For an example, the second nitride semiconductor layer 170 can have the uneven shape 172 formed on the surface. For an example, the uneven shape 172 can be a photonic crystal structure, or roughness. The photonic crystal structure can be formed by etching with a mask, and the roughness can be formed by surface treatment with chemical. And, the uneven shape 172 can be a nanocone. Particularly, the second nitride semiconductor layer 170 can have an opening 175 which exposes a portion of the first nitride semiconductor layer 190.

And, the first electrode pad 180 can be disposed on the first nitride semiconductor layer 190 exposed by the opening 175. The first electrode pad 180 can be in contact with the first nitride semiconductor layer 190 through the opening 175.

And, the first electrode pad 180 can be disposed in the opening 175 to be spaced from the second nitride semiconductor layer 170 so that the first electrode pad 180 is not in contact with the second nitride semiconductor layer 170.

And, the first nitride semiconductor layer 190 can have a roughness 185 at a portion exposed by the opening 175. The roughness 185 serves to make a surface area of an exposed portion of the first nitride semiconductor layer 190 greater.

And, the first electrode pad 180 is in contact with the roughness 185 of the first nitride semiconductor layer 190. The contact area increase between the first electrode pad 180 and the first nitride semiconductor layer 190 owing to the roughness 185 increases adhesive force between the first electrode pad 180 and the first nitride semiconductor layer 190.

The first electrode pad 180 can be formed of any one metal selected from chrome Cr, nickel Ni, aluminum Al, titanium Ti, platinum Pt or an alloy of the metals.

The first electrode pad 180 can be in contact with the first nitride semiconductor layer 190 directly, wherein since the first nitride semiconductor layer 190 of indium doped nGaN has a work function greater than that of no n-type indium doped or less doped second nitride semiconductor layer 170, the first nitride semiconductor layer 190 has an effect of dropping an operation voltage of the light emitting device.

Figure 2A:
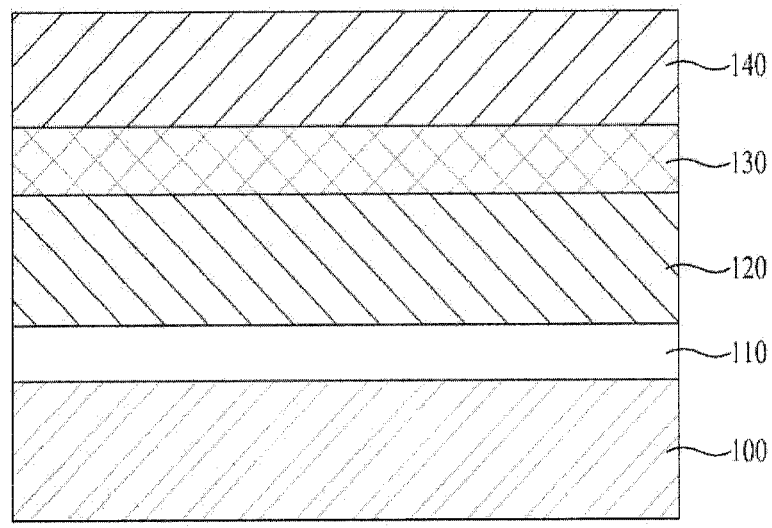
FIGS. 2A~2F illustrate sections showing the steps of a method for fabricating the light emitting device in accordance with a preferred embodiment of the present invention.

FIGS. 2A~2F illustrate sections showing the steps of a method for fabricating the light emitting device in accordance with a preferred embodiment of the present invention. As shown in FIG. 2A, a light emitting structure is formed on a substrate 100. The substrate 100 can be formed of sapphire $Al_2O_3$, GaN, SiC, ZnO, Si, GaP, InP, $Ga_2O_3$, and GaAs. The light emitting structure can be formed of nitride semiconductor. The light emitting structure can include a first conductive type semiconductor layer 120, an active layer 130, and a second conductive type semiconductor layer 140.

The light emitting structure can be formed by Metal Organic Chemical Vapor Deposition MOCVD, Chemical Vapor Deposition CVD, Plasma-Enhanced Chemical Vapor Deposition PECVD, Molecular Beam Epitaxy MBE, or Hydride Vapor Phase Epitaxy HVPE, but methods for forming the light emitting structure are not limited to above.

And, a buffer layer 110 can be grown between the light emitting structure and the substrate 100. The buffer layer 110, provided for moderating lattice mismatch and a difference of thermal expansion coefficients between the substrate 100 and the light emitting structure, can be formed of a low temperature grown GaN layer or AlN layer.

And, the first conductive type semiconductor layer 120 can be grown on the buffer layer 110. The first conductive type semiconductor layer 120 can include, for an example, an n-type semiconductor layer formed of a semiconductor material having composition of $In_xAl_yGa_{1-x-y}N$ ($0 \leq x \leq 1$, $0 \leq y \leq 1$, $0 \leq x+y \leq 1$), selected from, for an example, GaN, AlN, AlGaN, InGaN, InN, InAlGaN, AlInN, and can be doped with n-type dopant, such as Si, Ge, Sn, Se, Te.

An undoped semiconductor layer can be formed under the first conductive type semiconductor layer 120. The undoped semiconductor layer, formed for improving crystallinity of the first conductive type semiconductor layer, can be identical to the first conductive type semiconductor layer 120 except the undoped semiconductor layer has electric conductivity lower than that of the first conductive type semiconductor layer since the undoped semiconductor has no n-type dopant doped therein.

The active layer 130 is grown on the first conductive type semiconductor layer 120. The active layer 130 can have a single or a multi-quantum well MQW structure, and can include a quantum wire structure, or a quantum dot structure.

The active layer 130 can include a well layer and a barrier layer of a compound semiconductor material of third to fifth group elements having at least one period, such as InGaN well layer/GaN barrier layer, InGaN well layer/AlGaN barrier layer, and InGaN well layer/InGaN barrier layer. A conductive type clad layer can be formed of GaN group semiconductor on or/and an underside of the active layer 130.

Then, the second conductive type semiconductor layer 140 is grown on the active layer 130. The second conductive type semiconductor layer 140 can include a nitride semiconductor material having composition of $In_xAl_yGa_{1-x-y}N$ ($0 \leq x \leq 1$, $0 \leq y \leq 1$, $0 \leq x+y \leq 1$) doped with p-type dopant, such as Mg, or Zn.

Figure 2B:
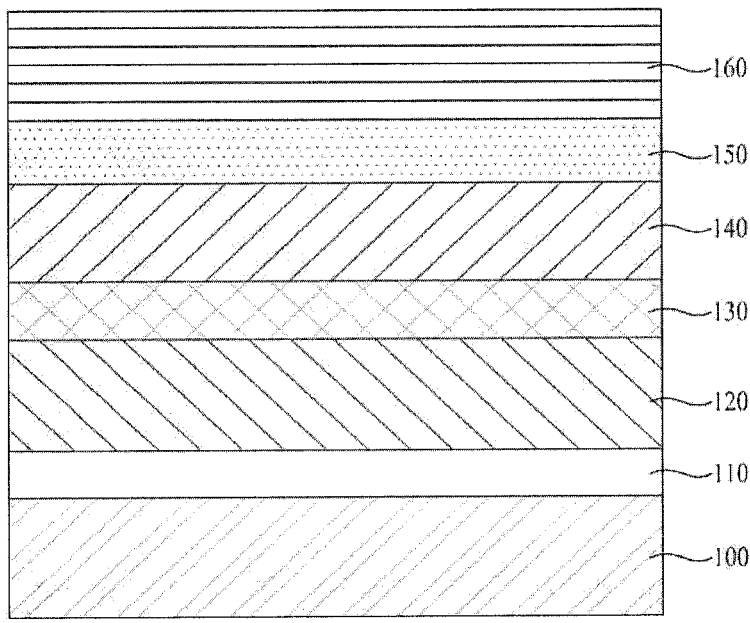

Then, referring to FIG. 2B, an ohmic layer 150 and a conductive support 160 are formed on the second conductive type semiconductor layer 140. The conductive support 160 can include at least one of aluminum Al, titanium Ti, chrome Cr, nickel Ni, copper Cu, and gold Au, and can be constructed of single layered structure or multiple layered structure, and can function as an electrode connected to the second conductive type semiconductor layer 140.

And, since the second conductive type semiconductor layer 140 has a low impurity concentration doped therein causing high contact resistance and a poor ohmic characteristic, the ohmic layer 150 can be a transparent electrode layer for improving the ohmic characteristic. For an example, the ohmic layer 150 can be formed of ITO, IZO, Ni, Ag, Al, and Pt. Particularly, the ohmic layer 150 can be constructed of a transparent electrode layer having two layers of Ni and Au. The transparent electrode layer increases a current injection area and forms ohmic contact so as to drop a forward direction voltage $V_f$.

Figure 2C:
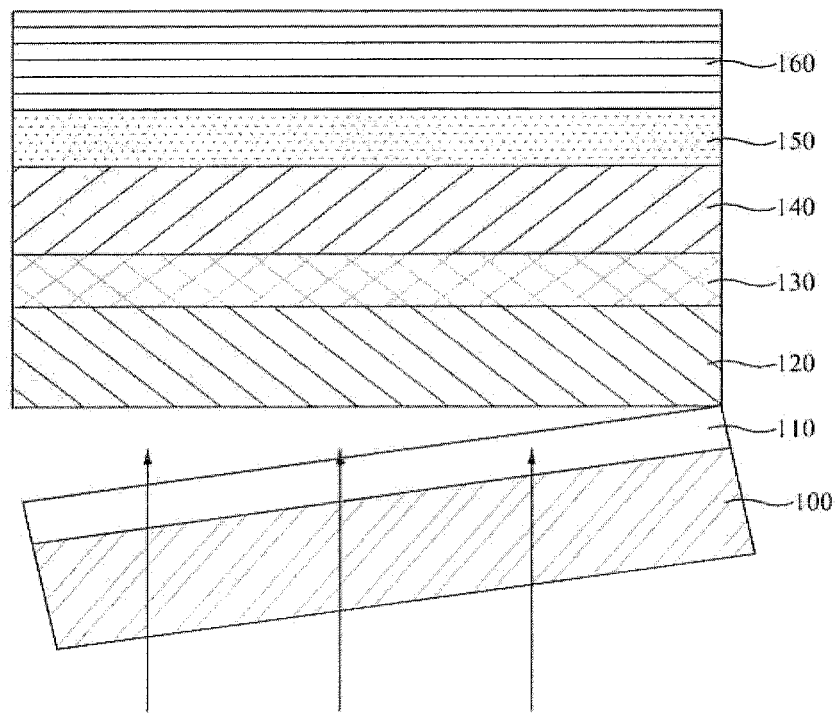

Then, referring to FIG. 2C, the buffer layer 110 and the substrate 100 are removed. The substrate 100 can be removed by laser lift off LLO with an excimer laser, dry etching, or wet etching.

At the time the laser lift off is performed for removal of the substrate 100, upon directing a laser beam having an energy smaller than an energy band gap of the sapphire substrate 100 and greater than an energy band gap of the first conductive type semiconductor layer 120, the buffer layer 110 absorbs the laser beam to cause separation of the sapphire substrate 100.

Figure 2D:
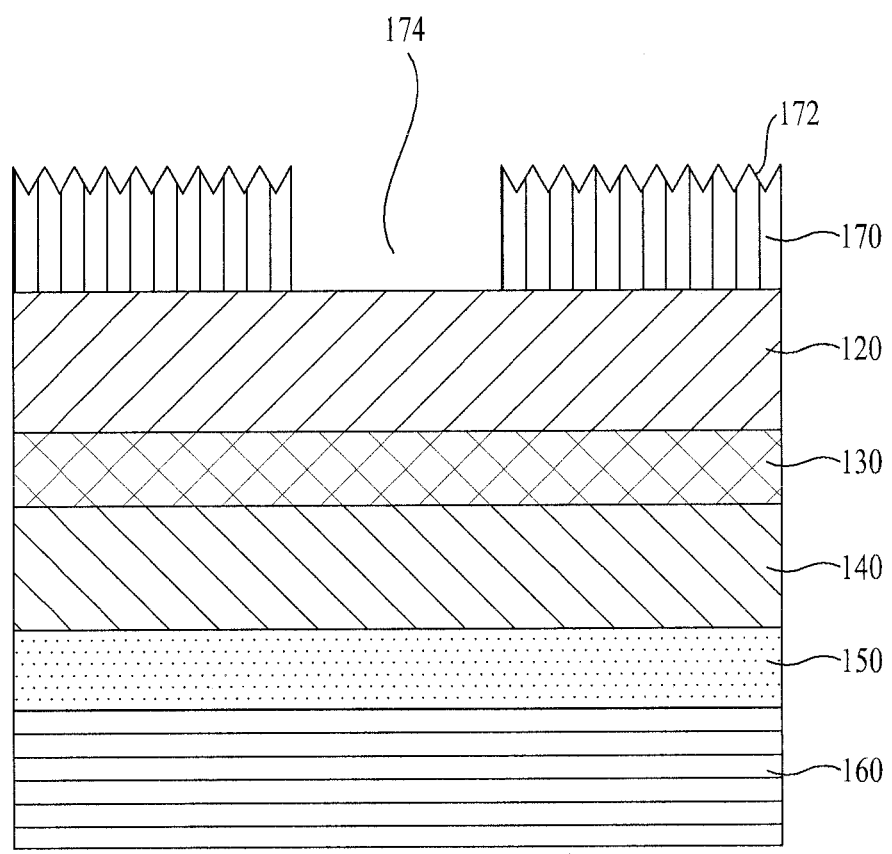

Then, referring to FIG. 2D, a nitride semiconductor layer 170 is formed on the first conductive type semiconductor layer 120. The nitride semiconductor layer 170 is formed of an n⁻ doped semiconductor material having composition of $In_xAl_yGa_{1-x-y}N$ (Where $0 \leq x \leq 1$, $0 \leq y \leq 1$, $0 \leq x+y \leq 1$), particularly, of nGaN at a thickness of 0.01~5.0 μm.

Then, an uneven shape 172 is formed on a surface of the nitride semiconductor layer 170. The uneven shape 172 can be a photonic crystal structure formed by etching process using a mask, or roughness formed by surface treatment using chemical. Or, the uneven shape 172 can be a nanocone. Then, a portion of the nitride semiconductor layer 170 is removed to have an opening 174 which exposes the first conductive type semiconductor layer 120, directly.

It is preferable that the nitride semiconductor layer 170 is grown at a low temperature of 400~900° C., and more preferably at 600~800° C. by MOCVD(Metal Organic Chemical Vapor Deposition).

For an example, different from the first conductive type semiconductor layer 120, the active layer 130, and the second conductive type semiconductor layer 140, the nitride semiconductor layer 170 can be grown at the low temperature of 400~900° C. and a low flow rate of NH₃ gas. By controlling the temperature and the NH₃ flow rate, the nitride semiconductor layer 170 having the uneven shape 172, for an example, the nanocone, can be formed on the first conductive type semiconductor layer 120.

At the time the nitride semiconductor layer 170 is being grown, a pyramid shape can be formed by controlling a ratio of a horizontal growth to a vertical growth, of which control parameters are the growing temperature and the NH₃ flow rate. If the growth temperature is raised and the NH₃ flow rate is increased, the horizontal growth increases, and if the growth temperature is lowered and the NH₃ flow rate is decreased, the vertical growth increases. By controlling such growth parameters, the nanocone can be formed on the nitride semiconductor layer 170.

And, a portion of the nitride semiconductor layer 170 is removed, to form an opening 174 which exposes a portion of the first conductive type semiconductor layer 120.

Figure 2E:
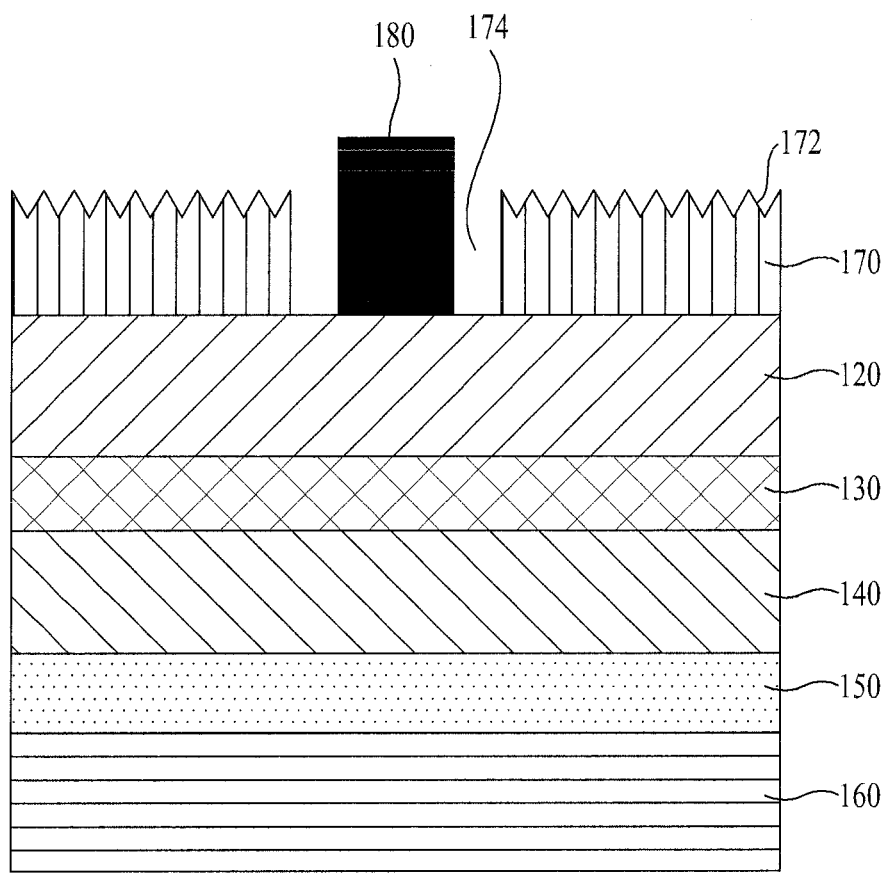

Next, referring to FIG. 2E, a first electrode pad 180 is formed on the first conductive type semiconductor layer 120 exposed by the opening 174. The first electrode pad 180 is in contact with the first conductive type semiconductor layer 120 exposed thus, directly. The first electrode pad 180 can be formed of one selected from chrome Cr, nickel Ni, gold Au, aluminum Al, titanium Ti, platinum Pt, or an alloy thereof.

Figure 2F:
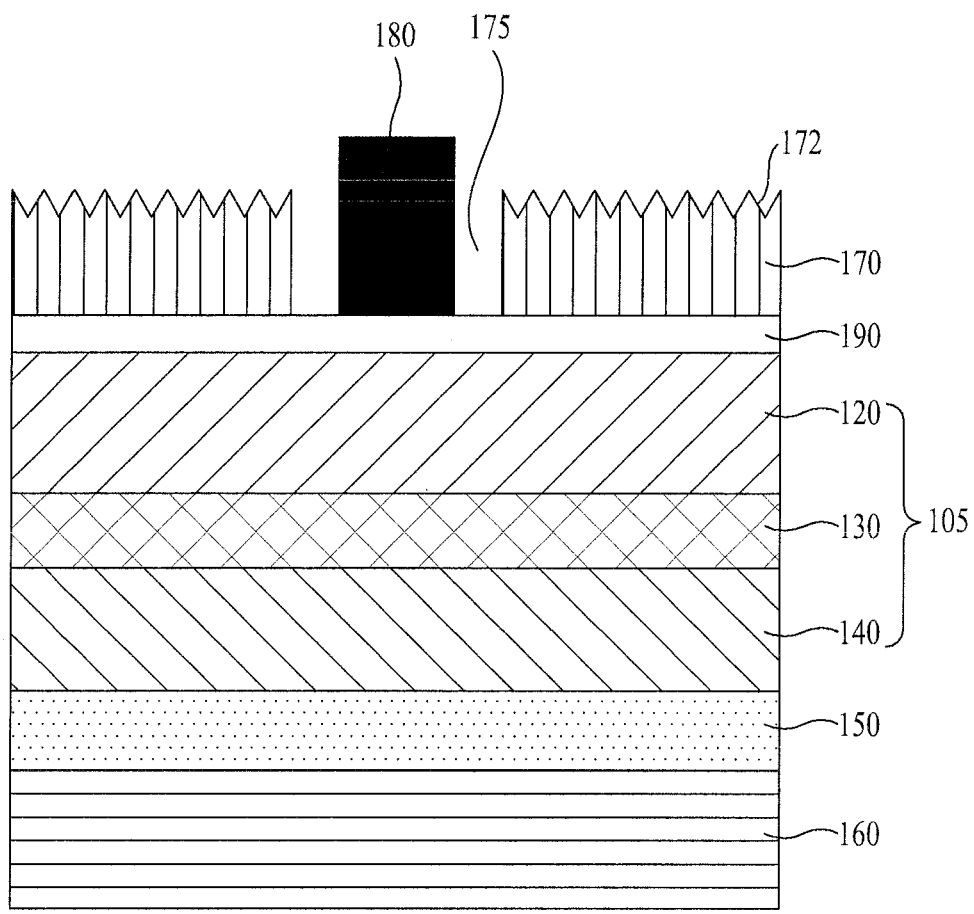

FIG. 2F illustrates a section showing a method for forming a light emitting device in accordance with another preferred embodiment which is different from the embodiment described with reference to FIGS. 2D and 2E. Steps identical to the description made with reference to FIGS. 2A~2C are performed.

Next, referring to FIG. 2F, a first nitride semiconductor layer 190 is formed on the first conductive type semiconductor layer 120 exposed by the laser lift off. Then, a second nitride semiconductor layer 170 is formed on the first nitride semiconductor layer 190. The first nitride semiconductor layer 190 and the second nitride semiconductor layer 170 can be the same with description made with reference to FIG. 1, respectively. And, the uneven shape, such as a photonic crystal structure, or a roughness, or a nanocone, is formed on a surface of the second nitride semiconductor layer 170.

Then, a portion of the second nitride semiconductor layer 170 is removed, to form an opening 175 which exposes a portion of the first nitride semiconductor layer 190. And, a first electrode pad 180 is formed on the first nitride semiconductor layer 190 exposed by the opening 175. The first electrode pad 180 can be in contact with the first nitride semiconductor layer 190, directly.

The first nitride semiconductor layer 190 can be formed by doping indium to nGaN at a thickness of 0.01~5.0 μm. The first nitride semiconductor layer 190 has a work function smaller than that of the second nitride semiconductor layer 170.

The first nitride semiconductor layer 190 of indium doped nGaN has a work function greater than that of no n-type indium doped or less doped second nitride semiconductor layer 170. Therefore, the first electrode pad 180 is in contact with the first nitride semiconductor layer 190 having a relatively low work function, providing an effect of dropping an operation voltage of the light emitting device.

FIGS. 3A~3F illustrate sections showing the steps of a method for fabricating a light emitting device in accordance with another preferred embodiment of the present invention. A method for fabricating a light emitting device in accordance with another preferred embodiment of the present invention will be described with reference to FIGS. 3A~3F.

Figure 3A:
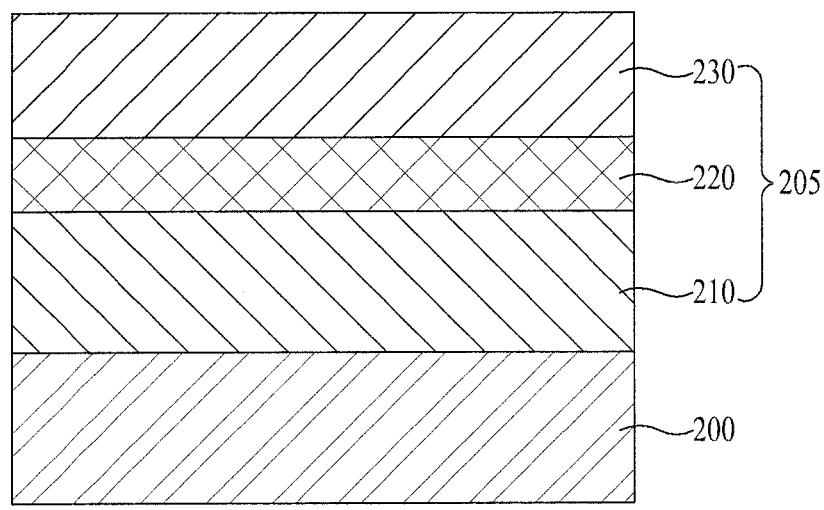
FIGS. 3A~3F illustrate sections showing the steps of a method for fabricating the light emitting device in accordance with another preferred embodiment of the present invention.

Referring to FIG. 3A, a light emitting structure 205 is grown on a substrate 200. The light emitting structure 205 can be constructed of a nitride semiconductor layer. The light emitting structure 205 can include a first conductive type semiconductor layer 210, an active layer 220, and a second conductive type semiconductor layer 230. Though not shown, a buffer layer can be formed between the substrate 200 and the light emitting structure 205.

And, materials and stacking methods of the first conductive type semiconductor layer 210, the active layer 220, and the second conductive type semiconductor layer 230 are identical to the light emitting device 100 described with reference to FIG. 1.

Figure 3B:
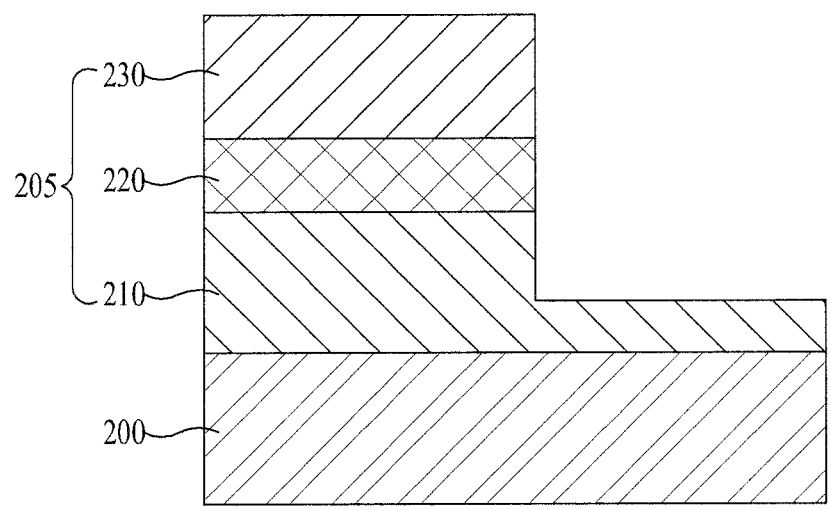

Then, referring to FIG. 3B, the second conductive type semiconductor layer 230, the active layer 220, and a portion of the first conductive type semiconductor layer 210 are mesa etched, to expose a region of the first conductive type semiconductor layer 210. The mesa etching can be RIE (Reactive Ion Etching).

Figure 3C:
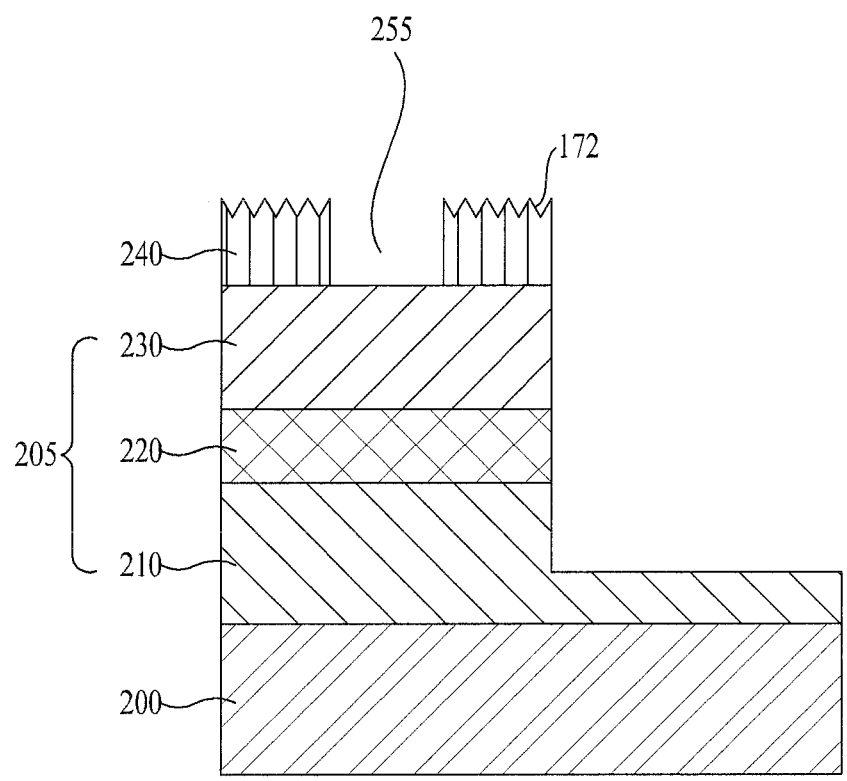
Figure 3D:
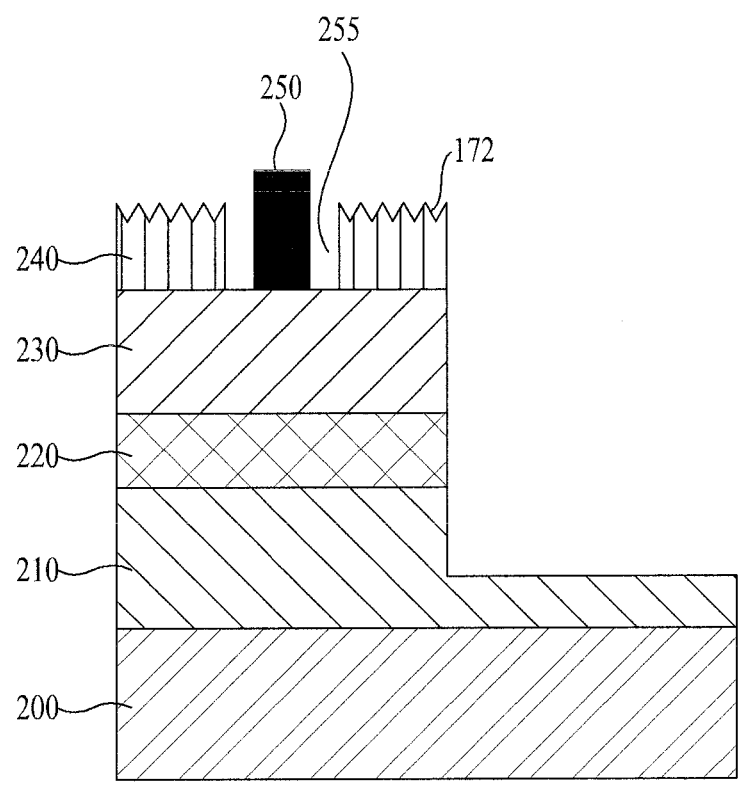

Then, referring to FIG. 3C, a nitride semiconductor layer 240 is formed on the second conductive type semiconductor layer 230. The nitride semiconductor layer 240 can be formed of a p⁻ doped semiconductor material having composition of $In_xAl_yGa_{1-x-y}N$ (Where, $0 \leq x \leq 1$, $0 \leq y \leq 1$, $0 \leq x+y \leq 1$), particularly can be formed of pGaN at a thickness of 0.01~5.0 μm.

The uneven shape, for an example, a nanocone can be formed on a surface of the second nitride semiconductor layer 240. Then, a portion of the second nitride semiconductor layer 240 is removed, to form an opening 255 which exposes a portion of the second conductive type semiconductor layer 230 under the nitride semiconductor layer 240.

Figure 3E:
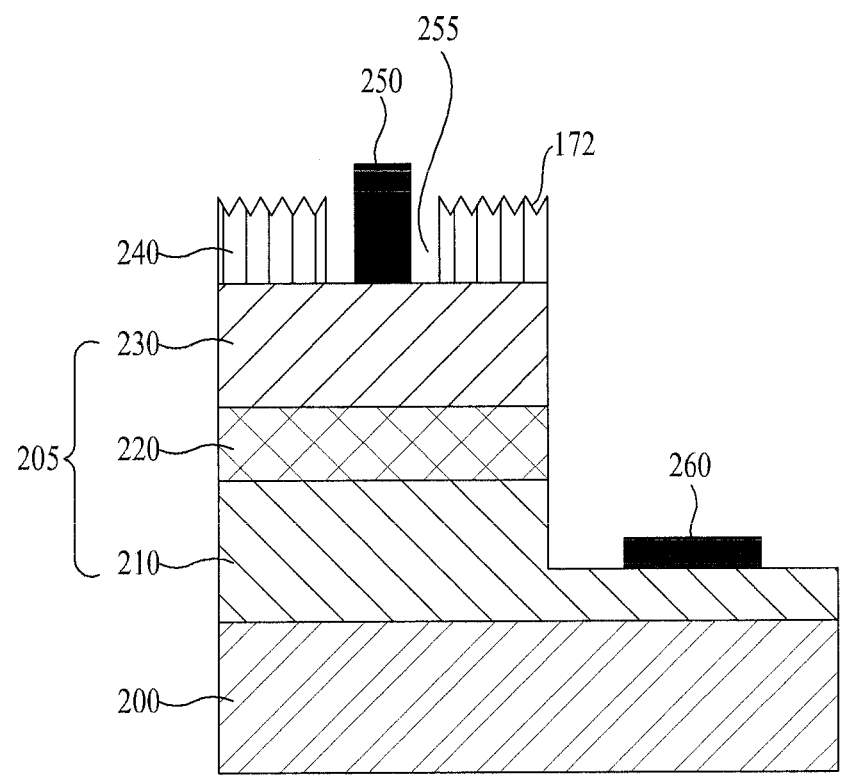

Then, referring to FIG. 3E, a second electrode pad 250 is formed on the second conductive type semiconductor layer 230 exposed by the opening 255. The second electrode pad 250 can be formed of one selected from chrome Cr, nickel Ni, gold Au, aluminum Al, titanium Ti, platinum Pt, or an alloy thereof.

Then, referring to FIG. 3E, a first electrode pad 260 is formed on the first conductive type semiconductor layer 210 exposed by the mesa etching. The first electrode pad 260 can be formed of a material identical to the second electrode pad 250, and the first electrode pad 260 and the second electrode pad 250 can be formed at a time.

Figure 3F:
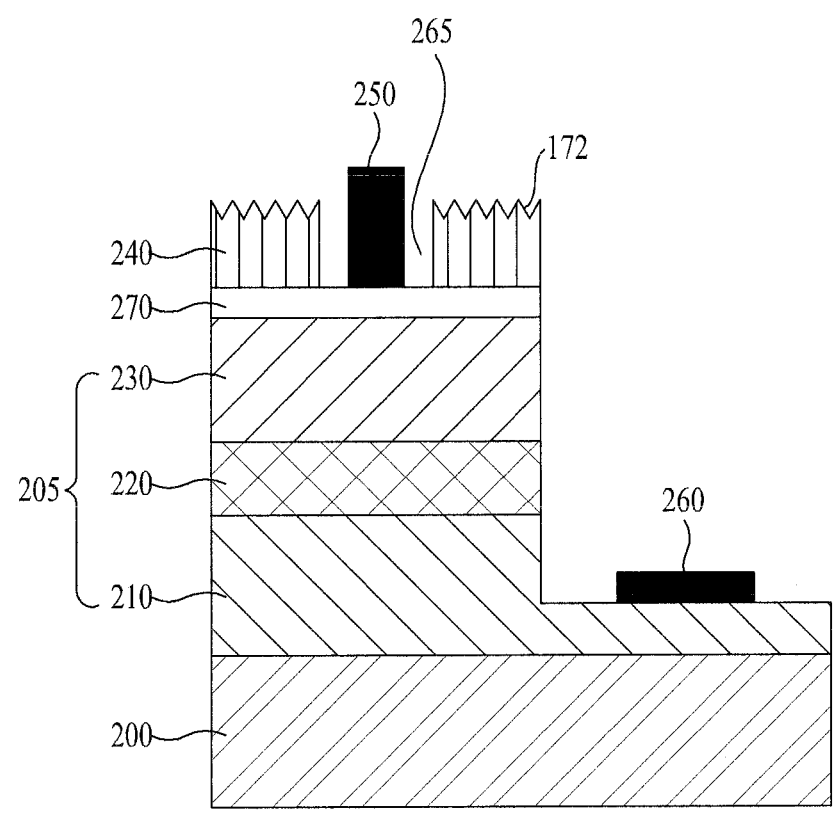

FIG. 3F illustrates a section showing a method for fabricating a light emitting device in accordance with another preferred embodiment different from the embodiment described with reference to FIGS. 3A~3E.

The method for fabricating a light emitting device in accordance with another preferred embodiment can be implemented by two different methods.

The first method is as follows.

Referring to FIGS. 3A and 3B, the light emitting structure 205 is formed on the substrate 200, which has the first conductive type semiconductor layer 210, the active layer 220, and the second conductive type semiconductor layer 230 stacked thereon, and the light emitting structure 205 is mesa etched to expose a portion of the first conductive type semiconductor layer 210.

The substrate 200 can be formed of a light transmissive material, for an example, any one of a sapphire substrate, a silicon Si substrate, a zinc oxide ZnO substrate, and a nitride semiconductor substrate or a template substrate having at least one of GaN, InGaN, AlInGaN, AlInGaN, SiC, GaP, InP, $Ga_2O_3$, and GaAs stacked thereon.

A first nitride semiconductor layer 270 is formed on the second conductive type semiconductor layer 230, and a second nitride semiconductor layer 240 is formed on the first nitride semiconductor layer 270. Then, the uneven shape 172, for an example, a nanocone, is formed on a surface of the second nitride semiconductor layer 240. And, a portion of the second nitride semiconductor layer 240 having the uneven shape 172 is removed to form an opening 265 which exposes the first nitride semiconductor layer 270.

The second electrode pad 250 is formed on the first nitride semiconductor layer 270 exposed through the opening 265, and the first electrode pad 260 is formed on the first conductive type semiconductor layer 210 exposed by the mesa etching.

The second method is as follows.

After forming the first conductive type semiconductor layer 210, the active layer 220, and the second conductive type semiconductor layer 230 on the substrate 200 in succession, the first nitride semiconductor layer 270, and the second nitride semiconductor layer 240 are formed on the second conductive type semiconductor layer 230, additionally. The first nitride semiconductor layer 270 and the second nitride semiconductor layer 240 can be identical to the first nitride semiconductor layer 190 and the second nitride semiconductor layer 170 described with reference to FIG. 1, respectively.

Next, the uneven shape 172, for an example, the nanocone, is formed on a surface of the second nitride semiconductor layer 240. And, the second nitride semiconductor layer 240, the first nitride semiconductor layer 270, the second conductive type semiconductor layer 230, the active layer 220, and a portion of the first conductive type semiconductor layer 210 are mesa etched, to expose a portion of the first conductive type semiconductor layer 210. Then, a portion of the second nitride semiconductor layer 240 remained after the mesa etching is removed, to form an opening 265 which exposes a portion of the first nitride semiconductor layer 270.

Next, the second electrode pad 250 is formed on the first nitride semiconductor layer 270 exposed through the opening 265, and the first electrode pad 260 is formed on the first conductive type semiconductor layer 210 exposed by the mesa etching.

According above description, the second electrode pad 250 of the embodiment is in contact with the first nitride semiconductor layer 270 which has a work function relatively smaller than that of the second conductive type semiconductor layer 230, providing an effect of dropping an operation voltage of the light emitting device. And, the vertical type light emitting device shown in FIG. 1 has effects of reduced operation voltage and greater heat dissipation because the electrodes are provided at a top and a bottom of the light emitting structure 105 causing the current to flow in a vertical direction.

Figure 4:
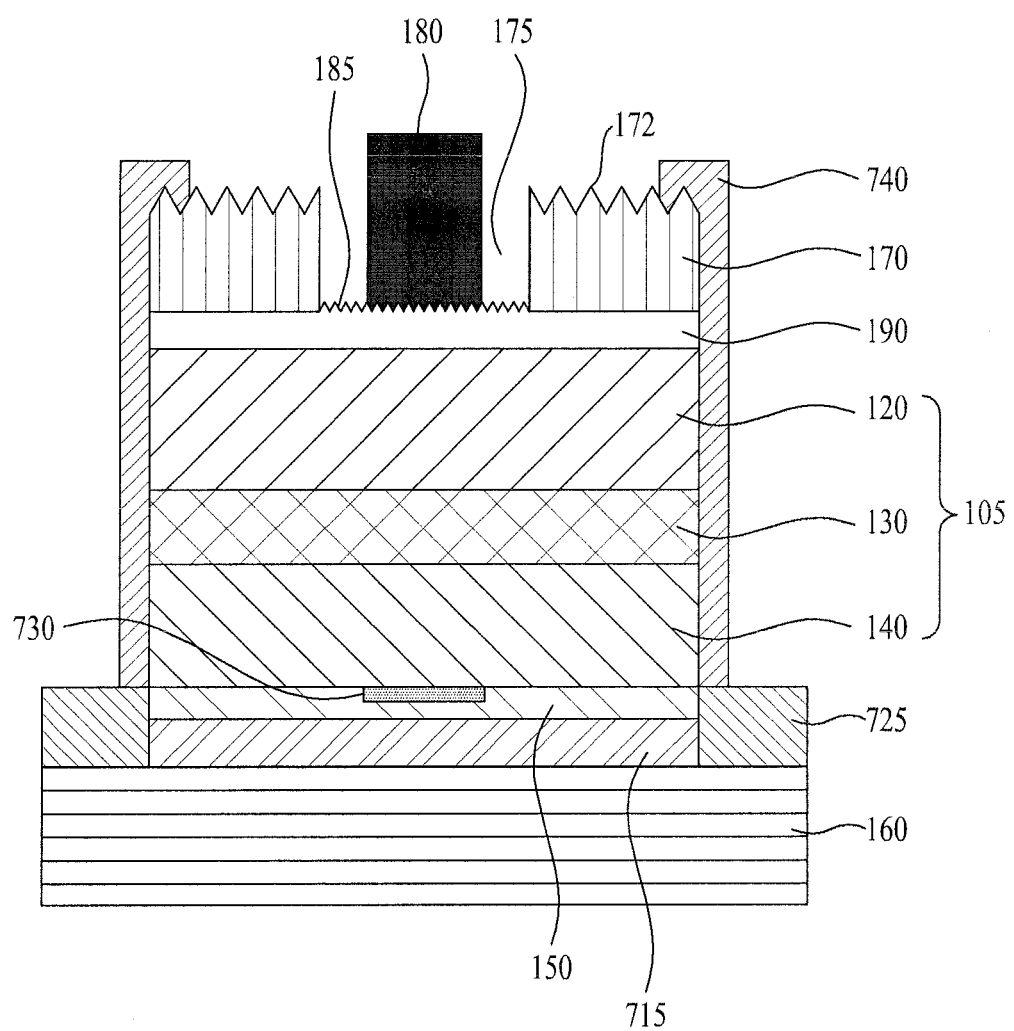
FIG. 4 illustrates a section of a light emitting device package in accordance with a preferred embodiment of the present invention.

FIG. 4 illustrates a section of a light emitting device in accordance with a preferred embodiment of the present invention. As shown in FIG. 4, the light emitting device includes a conductive support 160, a reflective layer 715, an ohmic layer 150, a protective layer 725, a current blocking layer 730, a light emitting structure 105, a first nitride semiconductor layer 190, a second nitride semiconductor layer 170, an insulating layer 740, and a first electrode pad 180. Reference numerals the same with FIG. 1 denote identical elements, and description duplicated with previous one will be omitted or described, briefly.

The reflective layer 715 is disposed between the conductive support 160 and the ohmic layer 150. The reflective layer 715 reflects a light from the light emitting structure 140 for improving optical extraction efficiency. The reflective layer 715 can be formed of at least one selected from Ag, Ni, Al, Rh, Pd, Ir, Ru, Mg, Zn, Pt, Au, and Hf or an alloy thereof. The reflective layer 715, provided for enhancing the optical efficiency, is not essential.

The protective layer 725 is disposed on the support 160 to surround sides of the reflective layer 715 and the ohmic layer 150. The protective layer 725 prevents an interface of the light emitting structure 105 and the support 160 from lifting off, which is caused to make reliability of the light emitting device poor. The protective layer 725 can be a non-conductive protective layer of a non-conductive material. For an example, the protective layer 725 can be formed of a material having electric conductivity lower than the reflective layer 715 or the ohmic layer 150, or an electric insulating material, such as ZnO or $SiO_2$.

The current blocking layer 730 is disposed between the ohmic layer 150 and the second conductive type semiconductor layer 140. The current blocking layer 730 can be disposed to overlap with at least a portion of a first electrode pad 180 to be described later. The current blocking layer 730 moderates current concentration between the first electrode pad 180 and the conductive support 160 for improving light emitting efficiency of the light emitting device.

The current blocking layer 730 can be formed of a material having electric conductivity lower than that of the reflective layer 715 or that of the ohmic layer 150, a material which forms Schottky contact with the second conductive type semiconductor layer 140, or an electric insulating material. For an example, the current blocking layer 730 can be formed of at least one selected from ZnO, $SiO_2$, SiON, $Si_3N_4$, $Al_2O_3$, $TiO_2$, Ti, Al, Cr.

The light emitting structure 105 is disposed on the ohmic layer 150 and the current blocking layer 730. The first nitride semiconductor layer 190 is disposed on the light emitting structure 105, and the second nitride semiconductor layer 170 is disposed on the first nitride semiconductor layer 190.

The first electrode pad 180 is disposed on the second nitride semiconductor layer 170 to overlap with the current blocking layer 730 in a vertical direction. The vertical direction can be a direction in which the second conductive type semiconductor layer 140 faces the first conductive type semiconductor layer 120.

The insulating layer 740 is disposed at sides of the light emitting structure 105, the first nitride semiconductor layer 190, and the second nitride semiconductor layer 170. Though the insulating layer 740 can be disposed on a portion of a top side of the second nitride semiconductor layer 170 and the top side of the protective layer 725, but the arrangement of the insulating layer 740 is not limited to this. The insulating layer 740 can be formed for protecting the light emitting structure 140, the first nitride semiconductor layer 190, and the second nitride semiconductor layer 170 electrically, and can be formed of, for an example, $SiO_2$, $SiO_x$, $SiO_xN_y$, $Si_3N_4$, $Al_2O_3$, but the material is not limited to this.

Figure 5:
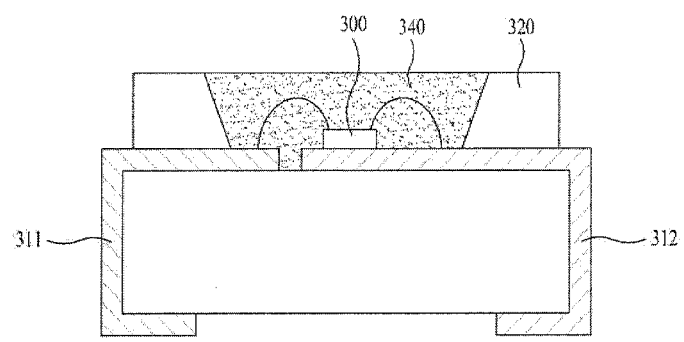
FIG. 5 illustrates an exploded perspective view of a lighting device having a light emitting device package in accordance with a preferred embodiment of the present invention applied thereto.

FIG. 5 illustrates a section of a light emitting device package in accordance with a preferred embodiment of the present invention. As shown in FIG. 5, the light emitting device package includes a package body 320, a first electrode layer 311 and a second electrode layer 312 mounted on the package body 320, a light emitting device 300 mounted on the package body 320 and connected to the first electrode layer 311 and the second electrode layer 312 electrically, and a filling material 340 for enclosing the light emitting device 300. The light emitting device 300 is identical to the light emitting devices described in foregoing embodiments.

The package body 320 can be formed of silicone, synthetic resin, or metal, and have a sloped reflective surface formed around the light emitting device 300, which can enhance the optical extraction efficiency.

The first electrode layer 311 and the second electrode layer 312 are separated from each other electrically, and provide power to the light emitting device 300. And, the first electrode layer 311 and the second electrode layer 312 can increase optical efficiency by reflecting the light from the light emitting device 300, and can dissipate heat from the light emitting device 300 to an outside of the light emitting device package.

The light emitting device 300 can be mounted on the package body 320 or the first electrode layer 311 or the second electrode layer 312.

The light emitting device 300 can be connected to the first electrode layer 311 and the second electrode layer 312 by any one type selected from wire bonding, flip chip bonding, or die bonding.

The filling material 340 can enclose the light emitting device 300 to protect the same. And, the filling material 340 can include a fluorescent material for changing a wavelength of the light from the light emitting device 300.

The light emitting device package can have at least one or a plurality of the light emitting devices in accordance with embodiments disclosed herein. However, the present invention does not limit a number of the light emitting devices to be mounted on the light emitting device package.

And, an array of the light emitting device packages can be on a substrate, and a light guide plate, a prism sheet, a diffusion sheet, and the like that are optical members can be disposed on a light path of the light emitting device package. The light emitting device package, the substrate, and the optical members can function as a lighting unit. As another embodiment, a display device, an indicating device, or a lighting system can be produced, which includes the semiconductor light emitting device or the light emitting device package described in the foregoing embodiments, and the lighting system can include a lamp or a street light.

Figure 6:
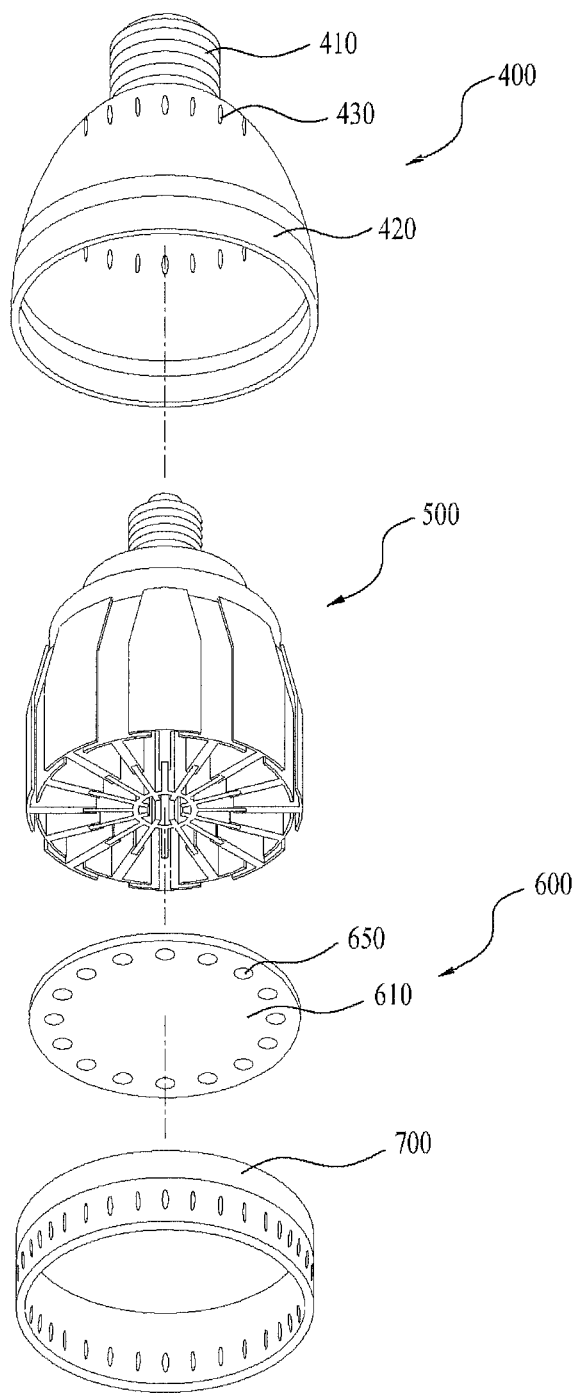
FIG. 6 illustrates an exploded perspective view of a lighting device having a light emitting device package in accordance with a preferred embodiment of the present invention applied thereto.

FIG. 6 illustrates an exploded perspective view of a lighting device having a light emitting device package in accordance with a preferred embodiment of the present invention applied thereto. As shown in FIG. 6, the lighting device includes a light source 600 for projecting a light, a housing 400 for housing the light source 600, a heat dissipating unit 500 for dissipating heat from the light source 600, and a holder 700 for fastening the light source 600 and the heat dissipating unit 500 to the housing 400.

The housing 400 includes a socket fastening portion 410 for fastening the housing 400 to an electric socket (not shown) and a body portion 420 connected to the socket fastening portion 410 for housing the light source 600. The body portion 420 can have an air flow opening 420 passing therethrough.

The body portion 420 of the housing 400 has a plurality of air flow openings 430. The air flow opening 430 may be singular or plural disposed radially as shown in the drawing. Besides this, the arrangement of the air flow opening 720 can vary.

And, the light source 600 has a plurality of light emitting device packages 650 disposed on a substrate 610. The substrate 610 can have a shape that can be placed in an opening of the housing 400, and can be formed of a material having high heat conductivity for transfer of heat to the heat dissipating unit 500.

And, a holder 700 is disposed under the light source, including a frame and another air flow openings. Though not shown, an optical member can be disposed to a lower side of the light source 600 for causing the light from the light emitting device package 650 of the light source 600 to diverge, scatter, or converge. The lighting device of the embodiment uses the light emitting device package with improved light efficiency for improving light emitting efficiency of the lighting device.

Figure 7A:
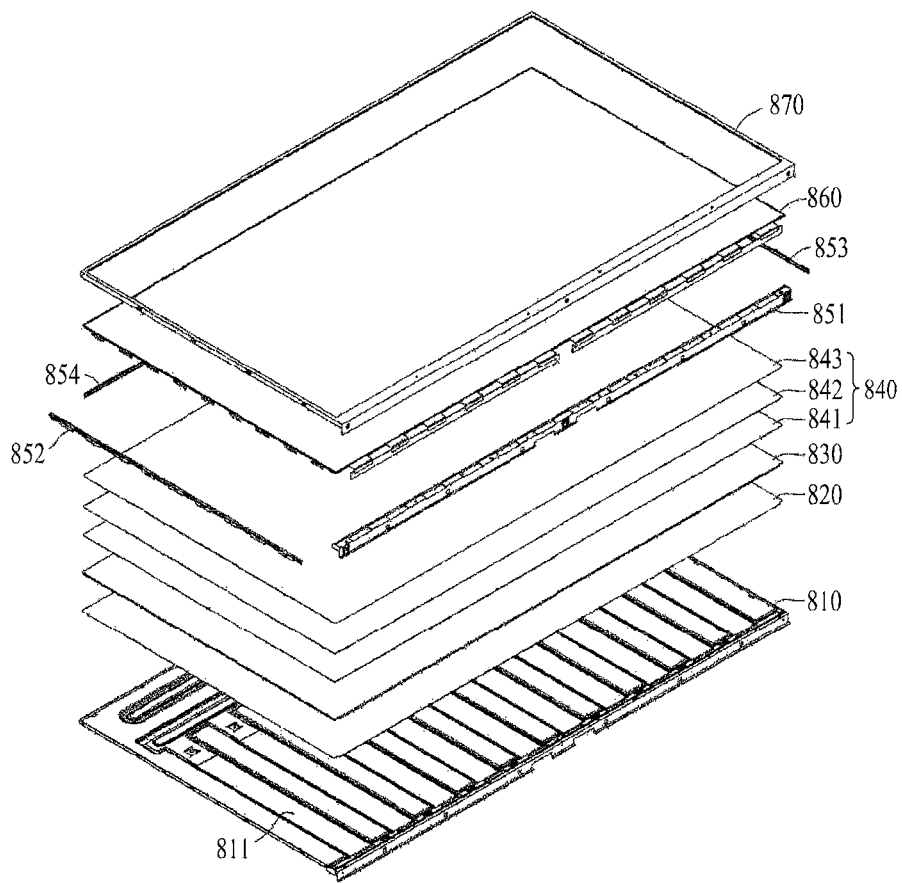
FIG. 7A illustrates an exploded perspective view of a display unit having a light emitting device package in accordance with a preferred embodiment of the present invention applied thereto.
Figure 7B:
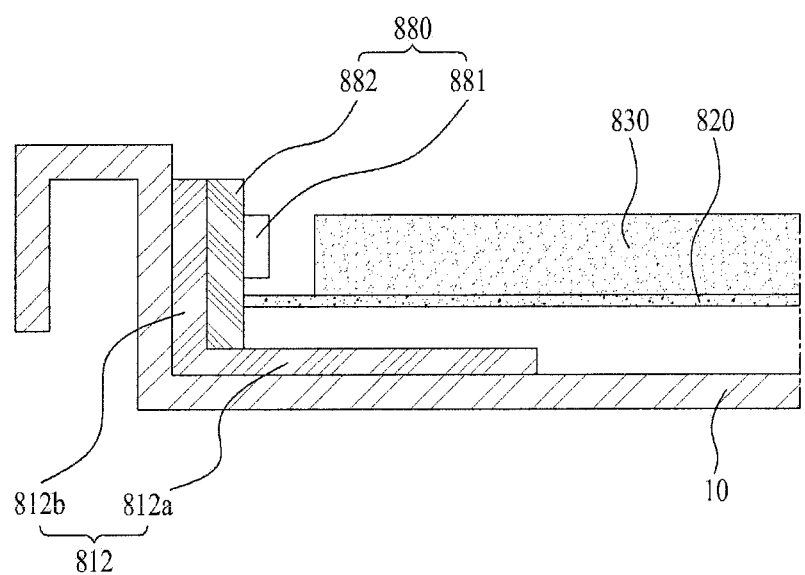
FIG. 7B illustrates a section of a light source portion of the display unit in FIG. 7A.

FIG. 7A illustrates an exploded perspective view of a display unit having a light emitting device package in accordance with a preferred embodiment of the present invention applied thereto, and FIG. 7B illustrates a section of a light source portion of the display unit in FIG. 7A.

Referring to FIGS. 7A and 7B, the display unit includes a backlight unit and a liquid crystal display panel 860, a top cover 870, and a fastening member 850.

The backlight unit includes a bottom cover 810, a light emitting module 880 on one side of inside of the bottom cover 810, a reflective plate 820 disposed on a front of the bottom cover 810, a light guide plate 830 disposed on a front of the reflective plate 820 for guiding the light from the light emitting module 880 toward a front of the display device, and an optical member 840 disposed on a front of the light guide plate 830. The liquid crystal display panel 860 is disposed on a front of the optical member 840, the top cover 870 is disposed to a front of the liquid crystal display panel 860, the fastening member 850 is disposed between the bottom cover 810 and the top cover 870 and fastened together with the bottom cover 810 and the top cover 870.

The light guide plate 830 serves to guide the light from the light emitting module 880 to be emitted as a surface light source, the reflective plate 820 on a rear of the light guide plate 830 causes the light from the light emitting module 880 to be reflected toward the light guide plate 830 for improving light efficiency. However, the reflective plate 820 can be provided as a separate element as shown in the drawing, or provided as a coat of a high reflectivity material applied to the rear of the light guide plate 830 or to the front of the bottom cover 810. The reflective plate 820 can be formed of a material which has high reflectivity and can be very thin, such as PolyEthylene Terephtalate PET.

And, the light guide plate 830 scatters the light from the light emitting module 880 for uniform distribution of the light to an entire region of a screen of the liquid crystal display panel 860. Accordingly, the light guide plate 830 is formed of a material having good refractivity and transmissivity, such as PolyMethylMethAcrylate PMMA, PolyCarbonate PC, or PolyEthylene PE.

And, the optical member 840 on the light guide plate 830 causes the light from the light guide plate 830 to diverge at a predetermined angle. The optical member 840 causes the light lead by the light guide plate 830 to travel toward the liquid crystal display panel 860, uniformly.

The optical member 840 can be a selective stack of optical sheets, such as a diffusion sheet, a prism sheet, or a protective sheet or a micro-lens array. A plurality of the optical sheets can be used, and can be formed of acryl resin, polyurethane resin, or transparent resin, such as silicone resin. And, the prism sheet can contain a fluorescent sheet.

The liquid crystal display panel 860 can be disposed to the front of the optical member 840. It is apparent that, instead of the liquid crystal display panel 860, other kinds of display device which requires the light source can be disposed to the front of the optical member 840.

The reflective plate 820 is placed on the bottom cover 810, and the light guide plate 830 is placed on the reflective plate 820. According to this, the reflective plate 820 can be in contact with the heat dissipating member (not shown) directly. The light emitting module 880 includes a light emitting device package 881 and a printed circuit board 882. The light emitting device package 881 is mounted on the printed circuit board 882. The light emitting device package 881 can be the embodiment illustrated in FIG. 5.

The printed circuit board 882 can be bonded to a bracket 812. The bracket 812 can be formed of a material having high heat conductivity for heat dissipation in addition to fastening of the light emitting device package 881, and though not shown, a heat pad can be disposed between the bracket 812 and the light emitting device package 881 for easy heat transfer. And, as shown, the bracket 812 has a "L" shape such that a transverse portion 812*a* is supported by the bottom cover 810 and the printed circuit board 882 is fastened to the longitudinal portion 812*b*.

As has been described, the light emitting device, the light emitting device package, and the lighting device of the present invention can improve optical efficiency.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device comprising:
   a support;
   a light emitting structure coupled to the support, the light emitting structure including a first conductive type semiconductor layer, a second conductive type semiconductor layer, and an active layer between the second conductive type semiconductor layer and the first conductive type semiconductor layer;
   a first nitride semiconductor layer coupled to the second conductive type semiconductor layer;
   a second nitride semiconductor layer coupled to the first nitride semiconductor layer and including an uneven surface; and
   a first electrode pad coupled to the light emitting structure, wherein:
   the second nitride semiconductor layer has an opening that exposes a portion of the first nitride semiconductor layer,
   the first electrode pad is directly coupled to the exposed portion of the first nitride semiconductor layer through the opening and is spaced from the second nitride semiconductor layer, and
   the exposed portion of the first nitride semiconductor layer directly coupled to the first electrode pad has a work function smaller than that of the second nitride semiconductor layer that is spaced from the first electrode,
   wherein at least one of the first nitride semiconductor layer or the second nitride semiconductor layer has a composition that includes indium, and wherein an indium content of the exposed portion of the first nitride semiconductor layer is greater than an indium content of the second nitride semiconductor layer.

2. The light emitting device in claim 1, wherein the second nitride semiconductor layer is a nitride semiconductor layer including indium.

3. The light emitting device in claim 1, wherein the first nitride semiconductor layer and the second nitride semiconductor layer include nGaN, and the first nitride semiconductor layer includes indium.

4. The light emitting device in claim 1, wherein the support includes a conductive material including at least one selected from the group consisting of copper, gold Au, nickel Ni, molybdenum Mo, and copper-tungsten Cu—W, and wherein the light emitting device further comprises an ohmic layer between the support and the light emitting structure.

5. The light emitting device in claim 1, wherein the support includes a substrate having light transmissivity.

6. The light emitting device in claim 5, wherein a portion of the first conductive type semiconductor layer is exposed, and wherein the light emitting device further comprises a second electrode pad coupled to the exposed portion of the first conductive type semiconductor layer.

7. The light emitting device in claim 3, wherein the first nitride semiconductor layer has a thickness of about 0.01 um to about 5.0 um.

8. The light emitting device in claim 3, wherein the second nitride semiconductor layer has a thickness of about 0.01 um to about 5.0 um.

9. The light emitting device claim 1, wherein the uneven surface includes a photonic crystal structure or a roughness.

10. The light emitting device in claim 1, wherein the first nitride semiconductor layer has a roughness at a portion exposed by the opening.

11. The light emitting device in claim 10, wherein the first electrode pad is coupled to a location that corresponds to the roughness of the first nitride semiconductor layer.

12. The light emitting device in claim 1, further comprising:
a reflective layer disposed between the support and an ohmic layer.

13. The light emitting device in claim 1, further comprising a current blocking layer disposed between an ohmic layer and the second conductive type semiconductor layer.

14. The light emitting device in claim 1, further comprising an insulating layer disposed at a side of each of the light emitting structure, the first nitride semiconductor layer, and the second nitride semiconductor layer.

15. The light emitting device in claim 1, further comprising:
a protective layer coupled to the support to surround sides of the reflective layer and an ohmic layer.

16. A light emitting device package comprising:
a package body;
a light emitting device coupled to the package body;
a first electrode layer and a second electrode layer coupled to the package body electrically connected to the light emitting device; and
a filling material at least partially around the light emitting device,
wherein the light emitting device includes a support, a light emitting structure coupled to the support, the light emitting structure including a first conductive type semiconductor layer, a second conductive type semiconductor layer, and an active layer between the second conductive type semiconductor layer and the first conductive type semiconductor layer, a first nitride semiconductor layer coupled to the second conductive type semiconductor layer, a second nitride semiconductor layer coupled to the first nitride semiconductor layer and including an uneven surface, and
a first electrode pad coupled to the light emitting structure, wherein:
the second nitride semiconductor layer has an opening that exposes a portion of the first nitride semiconductor layer,
the first electrode pad is directly coupled to the exposed portion of the first nitride semiconductor layer through the opening and is spaced from the second nitride semiconductor layer,
the exposed portion of the first nitride semiconductor layer directly coupled to the first electrode pad has a work function smaller than that of the second nitride semiconductor layer that is spaced from the first electrode,
at least one of the first nitride semiconductor layer or the second nitride semiconductor layer has a composition that includes indium, and
an indium content of the exposed portion of the first nitride semiconductor layer is greater than an indium content of the second nitride semiconductor layer.

17. A lighting system comprising:
a light source having a plurality of light emitting device packages on a substrate;
a housing for housing the light source;
a heat dissipating dissipater to dissipate heat from the light source; and
a holder to couple the light source and the heat dissipating dissipater to the housing, wherein the light emitting device package includes:
a package body,
a light emitting device coupled to the package body,
a first electrode layer and a second electrode layer coupled to the package body and electrically connected to the light emitting device, and
a filling material at least partially around the light emitting device,
wherein the light emitting device includes:
a support,
a light emitting structure coupled to the support, the light emitting structure including a first conductive type semiconductor layer, a second conductive type semiconductor layer, and an active layer between the second conductive type semiconductor layer and the first conductive type semiconductor layer, a first nitride semiconductor layer coupled to the second conductive type semiconductor layer, a second nitride semiconductor coupled to the first nitride semiconductor layer and including an uneven surface, and
a first electrode pad coupled to the light emitting structure, wherein:
the second nitride semiconductor layer has an opening that exposes a portion of the first nitride semiconductor layer,
the first electrode pad is directly coupled to the exposed portion of the first nitride semiconductor layer through the opening and is spaced from the second nitride semiconductor layer,
the exposed portion of the first nitride semiconductor layer directly coupled to the first electrode pad has a work function smaller than that of the second nitride semiconductor layer that is spaced from the first electrode,
at least one of the first nitride semiconductor layer or second nitride semiconductor layer has a composition that includes indium, and
an indium content of the exposed portion of the first nitride semiconductor layer is greater than an indium content of the second nitride semiconductor layer.

* * * * *